United States Patent [19]

Thompson et al.

[11] 4,263,336

[45] Apr. 21, 1981

[54] REDUCED PRESSURE INDUCTION HEATED REACTOR AND METHOD

[75] Inventors: Stephen W. Thompson, Scottsdale; Harry G. Smith, Phoenix; Richard S. Rosler, Paradise Valley, all of Ariz.

[73] Assignee: Motorola, Inc., Schaumburg, Ill.

[21] Appl. No.: 98,098

[22] Filed: Nov. 23, 1979

[51] Int. Cl.³ .............................................. C23C 11/06
[52] U.S. Cl. ................................ 427/45.1; 219/10.41; 219/10.49 R; 427/82; 427/85
[58] Field of Search ............... 427/45.1, 46, 85, 82; 219/10.41, 10.49

[56] References Cited

U.S. PATENT DOCUMENTS

| | | | |
|---|---|---|---|
| 2,826,666 | 3/1958 | Cater | 219/10.49 |
| 3,573,974 | 4/1971 | Castrucci et al. | 427/45.1 |
| 3,868,924 | 3/1975 | Reuschel et al. | 219/10.49 |
| 3,900,597 | 8/1975 | Chruma et al. | 427/82 |
| 4,098,923 | 7/1978 | Alberti et al. | 427/85 |

*Primary Examiner*—John H. Newsome
*Attorney, Agent, or Firm*—John A. Fisher

[57] ABSTRACT

A reduced pressure induction heated reactor and method for the deposition, especially epitaxial deposition, onto workpieces placed in the reactor. The workpieces are positioned within a hollow susceptor which is, in turn, positioned within a reactor tube. The ends of the reactor tube are sealed by end caps which provide for input and exhaust of reactant species. The workpieces are inductively heated by an RF induction coil which surrounds the reactor tube and which inductively couples with the susceptor. A vacuum pump maintains a low pressure within the reactor tube. Low pressure deposition is made possible without arcing by shorting together the susceptor and end caps and by having the shorted together combination electrically floating.

16 Claims, 2 Drawing Figures

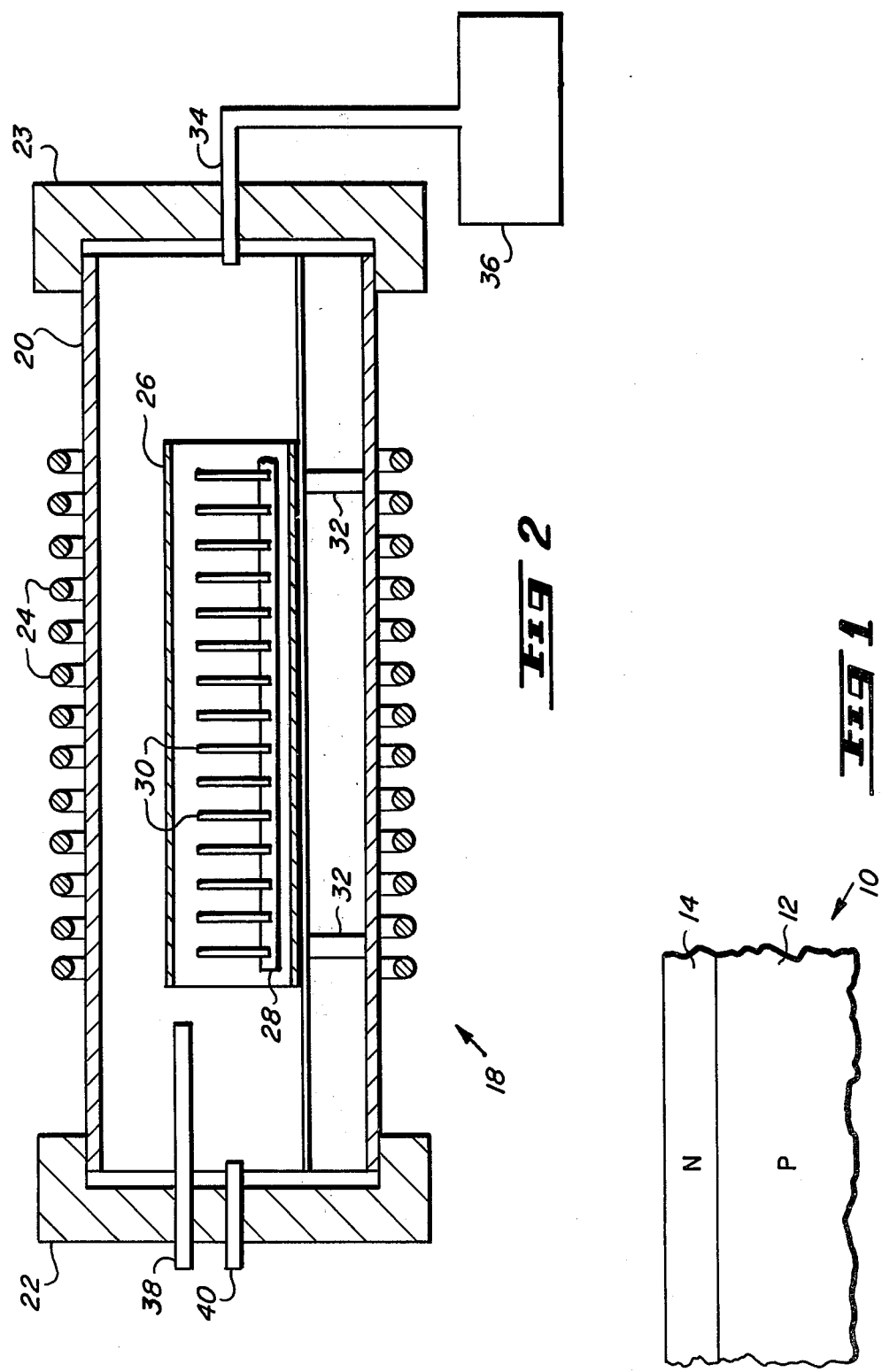

REDUCED PRESSURE INDUCTION HEATED REACTOR AND METHOD

BACKGROUND OF THE INVENTION

This invention relates to a method and apparatus for reduced pressure induction heated deposition. More specifically, the invention relates to the low pressure, induction heat epitaxial deposition of thin layers on semiconductor bodies.

The processing of many of the various semiconductor devices and circuits requires the growth of an epitaxial layer of semiconductor material onto a polished semiconductor substrate. At present, the growth of that epitaxial layer is one of the most expensive operations in the processing sequence. Almost all epitaxial layers are grown at atmospheric pressure in an RF induction heated reactor. This method for epitaxial growth, although widely used, has a number of serious drawbacks. Chief among these drawbacks are inefficient use of both reactant gases and power, non-uniformity of thickness and resistivity of the resulting epitaxial layer, auto-doping from the substrate, and, most importantly, low throughput. A number of attempts have been made to overcome one or more of these difficulties. It is recognized, for example, that most of the above-mentioned shortcomings could be overcome by carrying out the deposition at a reduced pressure. U.S. Pat. Nos. 3,900,597 and 4,098,923, for example, demonstrate the advantages of the low pressure deposition of polycrystalline silicon and pyrolytic silicon dioxide, respectively. The disclosures of these two patents, however, are not directly applicable to the growth of epitaxial layers for several reasons. Those disclosures show the deposition taking place in a hot-walled reaction tube continuously heated in a conventional resistance heated furnace. At the higher temperatures encountered in epitaxial growth (greater than about 900° C. for epitaxial silicon growth), deposition on the hot reactor tube wall causes the wall to weaken and finally to implode. Additionally, a clean, oxide-free substrate surface is essential for high quality epitaxial growth; but loading wafers into a continuously hot furnace without surface oxide formation is very difficult. Further, it is difficult to carry out the usual pre-growth, in situ etch of the surface with hydrochloric acid without also encountering a pre-reaction of the hydrochloric acid with material previously deposited on the reactor tube walls. And finally, deposition on the reactor walls tends to inhibit the desired epitaxial growth and makes it extremely difficult to achieve growth rates in excess of about 0.02 micrometers per minute.

One attempted solution is embodied in a radiant heated reduced pressure epitaxial reactor. Such reactors are operated, however, only at pressures of greater than about 80 torr (10.7 kPa). At this pressure there is some reduction in autodoping, but the full advantages of low pressure deposition, especially improved throughput, cannot be achieved at these pressures.

A further attempted solution is to use a cold wall, RF induction heated reactor, but such a reactor has not heretofore been feasible. At pressures less than about 150 torr (20 kPa), arcing tends to occur within the reactor. The arcing tends to occur between the susceptor and the end caps, and from the high potential to low potential ends of the suspector. The arcing or glow discharge inhibits normal epitaxial growth and results in extremely poor quality films.

Accordingly, a need existed to develop an apparatus and method for the reduced pressure, induction heated deposition of thin layers onto a substrate which would overcome the problems inherent in the prior art apparatus and methods.

It is therefore an object of this invention to provide a method and apparatus for the high volume deposition of uniform, high quality layers.

It is a further object of this invention to provide an apparatus for the reduced pressure, induction heated deposition of thin layers onto an object within the apparatus.

It is another object of this invention to provide an apparatus for low pressure deposition in which glow discharge arcing is suppressed.

It is still further object of this invention to provide a high volume process for the deposition of uniform epitaxial layers on semiconductor substrates.

SUMMARY OF THE INVENTION

The attainment of the foregoing and related objects and advantages of the invention is achieved through the use of the novel deposition apparatus herein disclosed.

In one embodiment of the invention, a reduced pressure, induction heated reactor for depositing material onto workpieces positioned within the reactor comprises a reactor tube closed at the end by end caps. The tube and end caps define a volume within which a reaction takes place. The end caps also provide means for entry and exit of reactant species. The tube is surrounded by an RF induction coil which, when energized, inductively couples to a hollow susceptor positioned within the tube. Workpieces to be deposited upon are positioned within the hollow susceptor and thus are screened from glow discharge arcs which may occur outside the susceptor. To reduce and, for the most part, to eliminate arcing, the end caps and susceptor are electrically shorted together and the shorted together combination is electrically floated.

The elements of the invention and the benefits to be derived therefrom will be more readily apparent after review of the following more detailed description of the invention taken in connection with the accompanying drawings.

BRIEF DESCRIPTION OF THE DRAWINGS

FIG. 1 depicts a portion of a semiconductor wafer produced in accordance with the invention.

FIG. 2 schematically shows in cross section a reactor apparatus.

DETAILED DESCRIPTION OF PREFERRED EMBODIMENTS

FIG. 1 shows a portion of a semiconductor wafer 10 and is illustrative of product to be produced using the apparatus and method in accordance with the invention. Wafer 10 is comprised of a substrate 12 having an epitaxial layer 14 grown thereon. The wafer, which might be used in the fabrication of diodes, transistors, integrated circuits, or the like, is, for example, about 50–100 mm in diameter. The epitaxial layer 14 is characterized by a resistivity and thickness determined by the circuit function to be implemented. For high yielding, properly functioning circuits the selected thickness and resistivity must be closely controlled and uniform across the entire wafer. Thickness control is determined by deposition temperature and the relationship between the diffusivity of reactant and reaction products and the thickness of a boundary layer at the workpiece surface. Both the diffusivity and boundary layer thickness are pressure dependent phenomena. Resistivity is dependent on auto doping from the substrate, especially if the substrate includes heavily doped buried layer regions. Uniformity of both thickness and resistivity is dependent on the kinetics of reactant flow. Control and uniformity of both resistivity and thickness are markedly improved by the reduced pressure growth process herein disclosed.

FIG. 2 schematically depicts in cross-section a reactor apparatus 18 in accordance with the invention. In the following, an apparatus specifically adapted for the epitaxial deposition of silicon layers onto silicon substrates will be described for purposes of illustration, but the invention is not to be construed as so limited. The apparatus includes a reactor tube 20 which is closed at the ends by end caps 22 and 23. Tube 20 is a conventional epitaxial reactor tube of quartz or similar material. The end caps are of stainless steel attached to the ends of the tube in a conventional manner. An RF induction heating coil 24 surrounds the reactor tube. The induction coil is connected to an RF generator (not shown) which is capable of supplying RF energy for heating.

The apparatus as so far described is similar to the conventional one-atmosphere epitaxial reactor. In that conventional reactor, workpieces such as silicon wafers would be placed flat upon a graphite susceptor positioned within the reactor. RF energy supplied to the coil 24 would inductively couple with the graphite susceptor causing the susceptor to heat. The wafers in contact with the susceptor would in turn be heated; but to be uniformly heated, the wafers must be lying on the susceptor. This severely restricts the number of wafers which can be placed in the reactor at any one time. The reactor capacity and thus the throughput cannot be increased by standing the wafers upright since the wafers would then no longer be heated uniformly since they would not be in uniform proximity to the heated susceptor.

The throughput problem is overcome in accordance with the present invention through the use of a hollw susceptor 26. The susceptor comprises, for example, graphite and has a circular cross section. The interior diameter of this susceptor is sufficient to accommodate a wafer holder 28 and a plurality of wafers 30. For semiconductor wafers, holder 28 is, for example, a conventional slotted four-rail quartz diffusion boat. The form of the workpiece holder is not important but it should accommodate an adequate number of closely spaced, upright wafers to maximize production capacity. The susceptor 26 is positioned approximately along the axis of tube 20 and is maintained in that position by supports 32. RF energy supplied to the induction coil 24 inductively couples with the hollow susceptor causing the susceptor to be heated. Susceptor 26 provides a uniform heat surrounding the wafers and causes them to be uniformly heated. Radially heating the wafers in this manner provides an additional advantage. In the prior art method, the wafers were heated from the back, through contact of the wafers with the susceptor establishing a temperature differential from back to front of the wafers. This temperature differential, which could be sufficient to cause slip or other crystalline defect, is eliminated by the radial heating produced in accordance with the invention.

End cap 23 is provided with a feedthrough 34 which leads to a vacuum pump shown schematically at 36. The vacuum pump permits operation of the reactor at reduced pressures. Reduced pressure operation improves the gas dynamics of the reactant species, improves uniformity and allows tighter control of the thickness and doping of the growing epitaxial layer. The reactor is preferably operated at a pressure of less than about 10 torr (1.3 kPa) with optimum results being achieved at a pressure less than about 2 torr (0.26 kPa).

At pressures less than about 150 torr (20 kPa), however, a glow discharge within the reactor chamber is likely. Arcing can occur between the susceptor and either end cap and at low enough pressures arcing can even occur between the high and low potential ends of the coil. This arcing is suppressed in accordance with the invention by shorting together the end caps 22, 23 and the hollow susceptor 26, and by electrically floating the shorted together combination of elements. By so doing, any arcing between the end caps and susceptor is suppressed. The wafers are effectively shielded from any arcing which occurs along the length of the coil by their location within the hollow susceptor.

End cap 22 is provided with feedthroughs 38, 40 by which reactant gases can be controllably admitted to the reaction zone. The term reactant gases is used to include inert gases which may be used for purging the reactor or as diluents, etchants, and the actual reactants which participate in the deposition process. To minimize the problem of unwanted deposition on reactor tube 20 and to minimize reactions other then in the vicinity of the wafers, an elongated feedthrough such as illustrated by feedthrough 38 or other manifold technique may be employed to selectively direct the entering reactant species to the desired location. Because end caps 22, 23 are electrically floating during the operation of the reactor, the feedthroughs must also be floating and must be electrically isolated from the normally metal gas supply lines.

The following non-limiting example illustrates the practice of the invention. Thirty silicon wafers having a selected resistivity range are precleaned in organic solvents. The wafers are approximately 0.5 mm in thickness and 50 mm in diameter. The wafers are loaded into a conventional four-rail quartz diffusion boat with a spacing between wafers of about 6 mm. The loaded boat is positioned within a hollow graphite susceptor which is, in turn, positioned on the axis of the reactor tube. The reactor tube is quartz, has a circular cross-section, and is about 180 mm in diameter. The susceptor has a circular cross-section with interior diameter of approximately 100 mm, and a length of approximately 400 mm. The susceptor wall is approximately 6 mm in thickness. Stainless steel end caps seal the ends of the reactor tube. When the end caps are in position the susceptor is shorted to the end caps by a graphite shorting strap. The RF induction coil which surrounds the reactor tube receives RF energy from a 38 Kw generator which operates at a frequency of 400 KHz.

After loading the reactor and sealing the ends, the reactor is evacuated to a pressure of less than about 10 microns (1.3 Pa) and then is purged with hydrogen. The susceptor and the wafers enclosed within the susceptor are then heated in hydrogen to the reaction temperature and baked in hydrogen for 2-3 minutes at that temperature. If an HCl etch of the wafer surfaces is desired, it can be carried out at this time. Following purge of the HCl from the reactor, reactant species which supply silicon for the growth of the silicon epitaxial layer are controllably introduced through the end cap. During this entire process, the supply of reactant gases and the vacuum pumping are adjusted to maintain the desired pressure within the reaction chamber. Pressures of 1-10 torr (0.1-1.3 kPa) are preferably employed, with optimum uniformity achieved at pressures of 1-2 torr (0.1-0.3 kPa). For the deposition of the silicon layer, a silicon source gas such as a silicon halide or silicon hydride is used. Silicon layers can be grown, for example, from the reaction of hydrogen and silicon tetrachloride or from the reaction of dichlorosilane and hydrogen. To any of these mixtures can be added an n- or p-type dopant such as phosphine or diborane to dope the resulting layer to the desired conductivity type and resistivity. Using dichlorosilane and hydrogen at a reaction temperature of 1050° C., a growth of 0.2-0.3 micrometers per minute is achieved at a pressure of approximate 2 torr (0.3 kPa).

Following the epitaxial growth, the reaction chamber is purged with hydrogen for two to three minutes and the wafers are cooled to room temperature. After backfilling the reactor with nitrogen, the reactor can be opened and the wafers removed. The wafers are examined and found to have a uniformity across an individual wafer and from wafer-to-wafer of better than ±4%. Defect density is comparable to the density achieved in conventional equipment.

Thus it is apparent that there has been provided, in accordance with the invention, an apparatus and method for the reduced pressure, induction heated deposition that fully meets the objects and advantages set forth above. The apparatus and method provide for uniform, controllable, and high throughput deposition. While the invention has been described in conjunction with the epitaxial growth of silicon on silicon substrates, it is not intended that the invention or its useage be so limited. While particularly useful for epitaxial deposition, the invention is also useful for non epitaxial deposition of heterogeneous or homogeneous layers on a variety of substrates. Different workpieces will, of course, require modifications in the physical attributes of the apparatus as well as optimization of the particular growth conditions. Such modifications and optimization will be apparent to those skilled in the art in the light of the foregoing description. Accordingly, it is intended to embrace all such variations as fall within the scope of the appended claims.

We claim:

1. A reduced pressure induction heated reactor for depositing material on workpieces in the reactor which comprises: first means defining a reaction volume, said first means surrounded by an induction coil capable of being energized by an RF energy source and said first means having an opening therein; second hollow means positioned within said first means for receiving the workpieces; third means positioned to seal said opening in said first means; shorting means electrically connecting said second means and said third means, said second means, third means and shorting means insulatively supported and electrically isolated from direct contact to external electrical potential.

2. The reactor of claim 1 further comprising fourth means for entry and exit of reactant species.

3. The reactor of claim 2 wherein said fourth means includes feedthroughs positioned in proximity to said workpieces.

4. The reactor of claim 1 wherein said first means comprises a quartz reactor tube.

5. The reactor of claim 1 wherein said second hollow means comprises a cylindrical graphite susceptor.

6. A reduced pressure induction heated reactor for depositing material on workpieces in the reactor, which comprises:
   a tube which defines a reaction volume;
   an induction coil surrounding said tube capable of being energized by RF energy from an RF generator;
   a hollow susceptor positioned within said tube within which the workpieces can be placed;
   electrically conductive end caps closing the ends of said tube;
   electrically insulated means for entry and exit of reactant species within said end caps; and
   shorting means electrically connecting said susceptor and said electrically conductive end caps, said electrically conductive end caps and susceptor being electrically floating.

7. The reactor of claim 6 wherein said electrically conductive end caps are stainless steel.

8. A process for the induction heated deposition of material onto workpieces positioned within a hollow susceptor within a reactor tube and surrounded by an RF induction coil which comprises the steps of:
   positioning a workpiece within said hollow susceptor;
   closing said reactor tube with electrically conductive end caps;
   electrically shorting said susceptor and said electrically conductive end caps;
   reducing the pressure within said reactor tube;
   introducing reactants into said reaction tube by electrically insulated means, said reactants comprising a source of material to be deposited;
   electrically floating said susceptor and said electrically conductive end caps; and
   heating said workpiece by energizing said RF induction coil to inductively heat said susceptor.

9. The process of claim 8 wherein said workpiece comprises a plurality of silicon wafers.

10. The process of claim 9 wherein said wafers each have two substantially flat surfaces and said wafers are positioned in a holder to place said flat surface of a first wafer in a face-to-face relationship with said flat surface of a second wafer.

11. The process of claim 8 wherein said reactants comprise silicon tetrachloride and hydrogen.

12. The process of claim 8 wherein said reactants comprise dichlorosilane and hydrogen.

13. The process of claim 8 wherein said pressure is reduced to less than about 10 torr (1.3 kPa).

14. The process of claim 13 wherein said pressure is reduced to about 1-2 torr (0.12-0.26 kPa).

15. A method for suppressing glow discharge arcs within a reduced pressure reactor wherein the reactor includes a reactor tube closed at the ends by electrically conductive end caps and an inductively heated susceptor positioned within the tube, the method comprising the steps of: shorting together the electrically conductive end caps and susceptor and electrically floating the shorted together end caps and susceptor.

16. In a reduced pressure induction heated reactor for depositing material on workpieces having a tube which defines a reaction volume surrounded by an induction coil capable of being energized by RF energy from an RF generator, a hollow susceptor positioned within said tube within which the workpiece can be placed, the improvement comprising:

electrically conductive end caps for closing said tube;

shorting means electrically connecting said susceptor and said electrically conductive end caps, said susceptor and electrically conductive end caps being electrically floating;

insulating means for entry and exit of reactant species.

* * * * *